US008970205B2

(12) United States Patent
Janecek et al.

(10) Patent No.: US 8,970,205 B2
(45) Date of Patent: Mar. 3, 2015

(54) ADJUSTABLE HALL EFFECT SENSOR SYSTEM

(75) Inventors: Thomas F Janecek, Flagstaff, AZ (US); Daniel S Cole, Flagstaff, AZ (US)

(73) Assignee: Electric Torque Machines Inc, Flagstaff, AZ (US)

( * ) Notice: Subject to any disclaimer, the term of this patent is extended or adjusted under 35 U.S.C. 154(b) by 229 days.

(21) Appl. No.: 13/420,567

(22) Filed: Mar. 14, 2012

(65) Prior Publication Data

US 2012/0235668 A1    Sep. 20, 2012

Related U.S. Application Data

(60) Provisional application No. 61/453,006, filed on Mar. 15, 2011.

(51) Int. Cl.
*G01R 33/07*    (2006.01)

(52) U.S. Cl.
CPC .............. *G01R 33/07* (2013.01); *G01R 33/072* (2013.01)
USPC .............. 324/117 H; 324/207.11; 324/207.2; 324/207.25; 324/207.13

(58) Field of Classification Search
CPC ............................. G01R 33/07; G01R 33/072
USPC ................ 324/117 H, 207.2, 207.11–207.25; 310/91
See application file for complete search history.

(56) References Cited

U.S. PATENT DOCUMENTS

| | | | | |
|---|---|---|---|---|
| 4,054,860 | A * | 10/1977 | Henderson et al. | 338/32 H |
| 6,710,505 | B1 * | 3/2004 | Barani et al. | 310/261.1 |
| 2003/0193673 | A1 * | 10/2003 | Yamamoto | 358/1.1 |
| 2004/0083753 | A1 * | 5/2004 | Kim et al. | 62/352 |
| 2005/0109304 | A1 * | 5/2005 | Rotter et al. | 123/182.1 |
| 2006/0077704 | A1 * | 4/2006 | Tuttle et al. | 365/158 |
| 2006/0131967 | A1 * | 6/2006 | Lin et al. | 310/12 |
| 2008/0264648 | A1 * | 10/2008 | Pietras et al. | 166/380 |
| 2009/0050418 | A1 * | 2/2009 | Vargas et al. | 188/1.11 L |
| 2009/0195195 | A1 * | 8/2009 | Huang | 318/135 |
| 2009/0308628 | A1 * | 12/2009 | Totsu | 173/176 |
| 2009/0309441 | A1 * | 12/2009 | Yang et al. | 310/91 |
| 2010/0031679 | A1 * | 2/2010 | Park | 62/129 |
| 2011/0115326 | A1 * | 5/2011 | Clark et al. | 310/114 |
| 2011/0232402 | A1 * | 9/2011 | Schaefer et al. | 74/399 |
| 2012/0126795 | A1 * | 5/2012 | Genoud et al. | 324/207.2 |

* cited by examiner

*Primary Examiner* — Tung X Nguyen
*Assistant Examiner* — David Frederiksen
(74) *Attorney, Agent, or Firm* — Invention To Patent Services; Alex Hobson

(57) ABSTRACT

A adjustable Hall effect sensor system having a sensor positioning component is described. In one embodiment, the Hall effect sensor system is an independently adjustable sensor system, having a plurality of Hall effect sensor, wherein one Hall effect sensor may be displaced and adjusted without effecting the location of another Hall effect sensor. A sensor positioning component comprising a paddle coupled to a main body portion by a more narrow neck is described. A cam may be configured on a paddle and provide for fine tuning the position of a Hall effect sensor. In one embodiment the main body and extensions are comprised essentially of a circuit board.

20 Claims, 12 Drawing Sheets

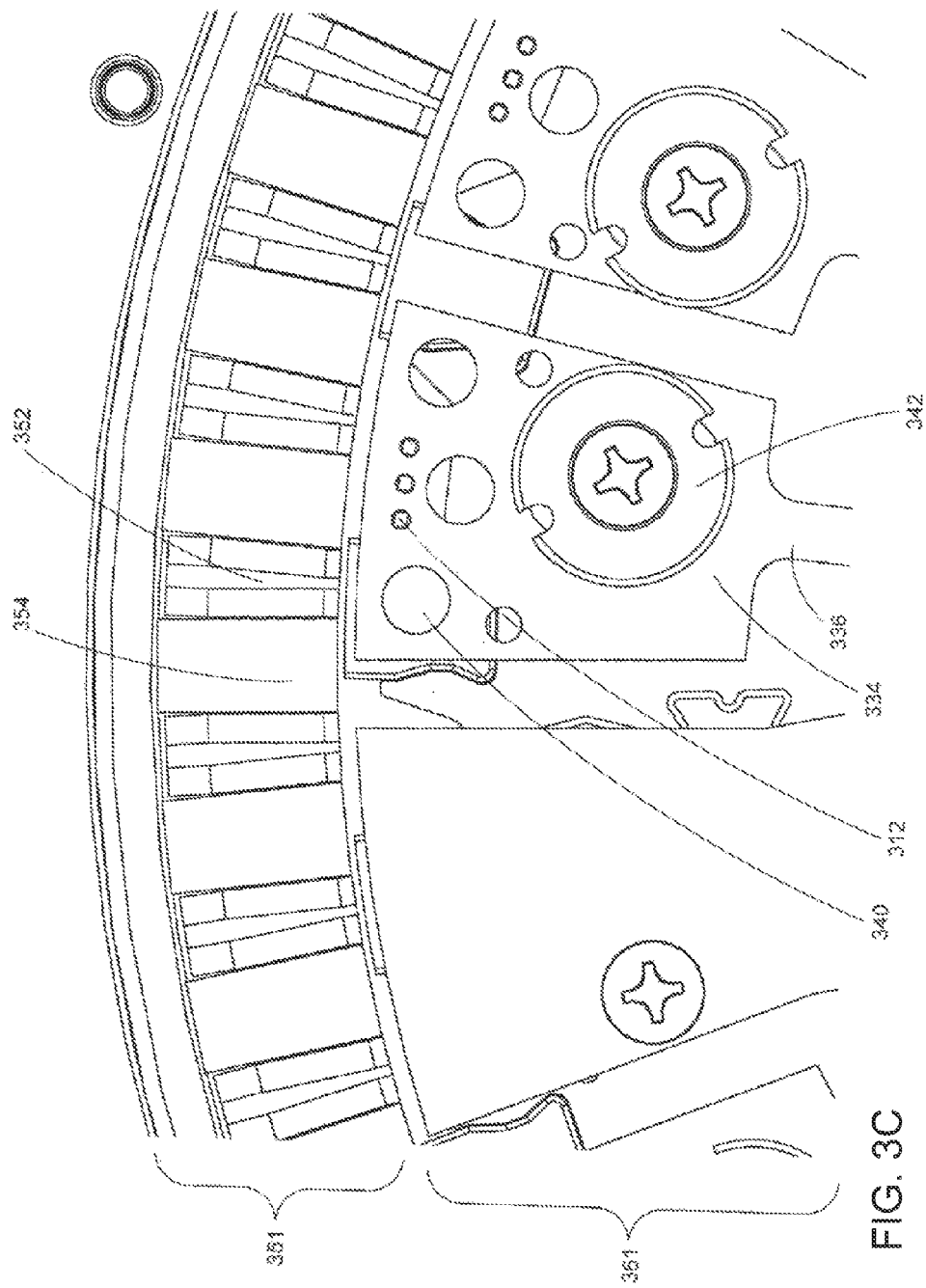

ADJUSTABLE HALL EFFECT SENSOR SYSTEM

CROSS REFERENCE TO RELATED APPLICATIONS

The present invention claims the benefit of U.S. Provisional Patent Application No. 61/453,006, filed on Mar. 15, 2011, which is incorporated by reference herein, in its entirety.

TECHNICAL FIELD

The present invention relates to a Hall effect sensor systems having a sensor positioning component.

BACKGROUND

Various approaches for utilizing Hall effect sensors, for example in connection with synchronous AC motors and/or brushless DC motors, are known in the art. However, positioning a Hall effect sensor in a desired location (and/or positioning multiple Hall effect sensors at various locations) can prove challenging, particularly in motors having small diameters and/or a high number of poles.

SUMMARY

The invention is directed to an adjustable Hall effect sensor system comprising a plurality of Hall effect sensors that may be independently adjustable. In one embodiment, the Hall effect sensor system described herein is configured as an independently positioning sensor system, whereby one Hall effect sensor may be adjusted without affecting the position of a second Hall effect sensor. The Hall effect sensor system described herein comprises a sensor positioning component comprising a main body portion, an adjustable component coupled to the main body portion, and at least one Hall effect sensor coupled to the adjustable components. In one embodiment, a plurality of adjustable components are coupled to the main body portion, and a plurality of Hall effect sensors are coupled to the adjustable components, as described herein. Any number of adjustable components and/or Hall effect sensor may be configured on the Hall effect sensor system including, but not limited to, one, two, three or more. The Hall effect sensor system described herein may comprise a printed circuit board or the main body portion and adjustable component may consist essentially of a printed circuit board, including extended portion. In one embodiment, the Hall effect sensor system described herein comprises a sensor positioning component that is comprised of a main body portion and extended portions that are made of a single printed circuit board. The Hall effect sensor system described herein may comprise a flexible circuit that may be coupled to the main body portion and to a Hall effect sensor. A flexible circuit may be a portion of an adjustable component, and provide for flexible positioning of the Hall effect sensor. The Hall effect sensor system described herein may comprises a cam that is coupled to an adjustable component. A cam may comprise at least one notch, a circular lobe, and an eccentric lobe, whereby rotation of the cam adjust a position of a Hall effect sensor. A cam may be configured to provide any suitable incremental positional adjustment of a Hall effect sensor, such as no more than 0.0508 mm in a rotational direction.

In some embodiments, the Hall effect sensor system described herein comprises a main body portion and extended portions that extend from the main body portion. The extended portions may be any suitable shape, and may be elongated members having an aspect ratio, or length to width of more than two. In some embodiments the extended portion may comprise a paddle shaped extended end coupled to the main body by a neck, wherein the neck has a smaller width than a paddle. A neck may have any suitable shape and may have one or more openings therein. An opening in a neck may be configured to allow for better flexibility or greater range of motion of the neck or paddle coupled thereto. An extended portion may have a free extended end, or may be coupled to another extended portion or flange or any other component of the Hall effect sensor system described herein. For example, an extended portion may comprise a paddle portion having a plurality of neck portions, wherein one neck portion is connected to the main body and the other neck portion is connected to a flange or other portion of the sensor positioning component.

The Hall effect sensor system described herein may be coupled to any type of motor or generator, and in some embodiments the motor may be configured with more than 50 poles, or a pole pitch of no more than 6 mm. The Hall effect sensor system described herein may be configured for fine positional adjustment of a Hall effect sensor, such as no more than 0.0508 mm in the rotational direction.

In some embodiment, the Hall effect sensor system described herein comprises a main body, a plurality of extended portions coupled to the main body, a plurality of cam and Hall effect sensors coupled to extended portions, wherein the Hall effect sensor system is configured as an independent positioning sensor system, whereby one Hall effect sensor may be adjusted in position without affecting the position of another Hall effect sensor. The position of a Hall effect sensor may be adjusted by turning a cam that flexes or moves the extended portion.

BRIEF DESCRIPTION OF THE DRAWINGS

With reference to the following description and accompanying drawings:

FIGS. 3A-3C illustrate isometric views of an exemplary adjustable Hall effect sensor system utilized in connection with an electric motor in accordance with an exemplary embodiment;

DETAILED DESCRIPTION

Figure 1:
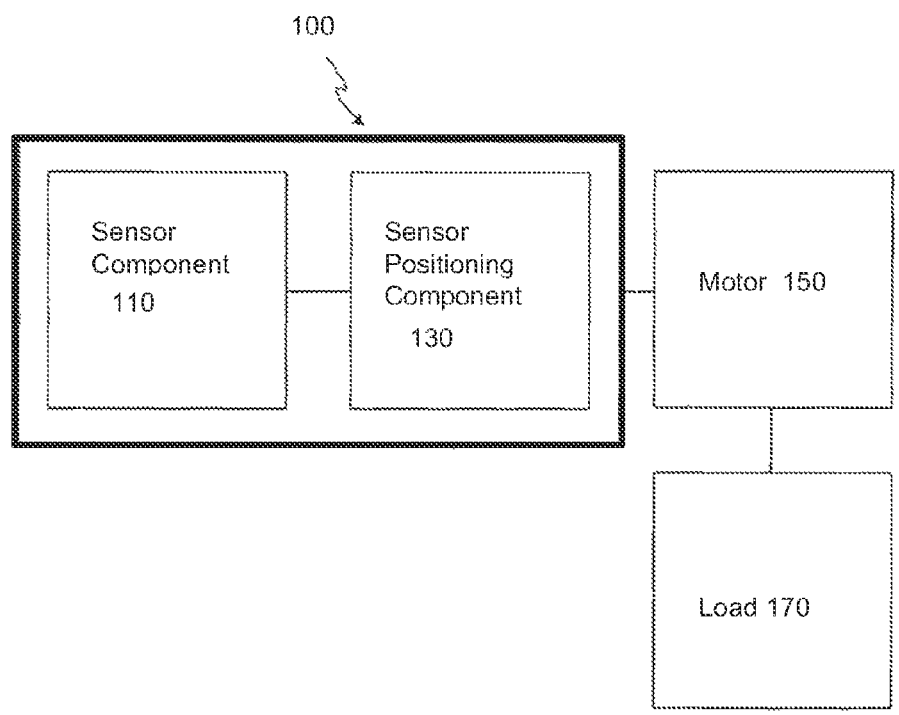
FIG. 1 illustrates a block diagram of an exemplary adjustable Hall effect sensor system in accordance with an exemplary embodiment.

The following description is of various exemplary embodiments only, and is not intended to limit the scope, applicability or configuration of the present disclosure in any way. Rather, the following description is intended to provide a convenient illustration for implementing various embodiments including the best mode. As will become apparent, various changes may be made in the function and arrangement of the elements described in these embodiments without departing from the scope of the present disclosure.

For the sake of brevity, conventional techniques for position sensing, electrical circuit assembly, printed circuit board manufacturing, and magnetic flux measurement, utilization, and/or control, as well as conventional techniques for electric motor configuration, utilization, and/or assembly, may not be described in detail herein. Furthermore, the connecting lines shown in various figures contained herein are intended to represent exemplary functional relationships and/or physical couplings between various elements. It should be noted that many alternative or additional functional relationships or physical connections may be present in a practical adjustable Hall effect sensor system, for example as utilized in connection with a polyphase electric motor and/or electric generator.

Prior Hall effect sensor systems, for example Hall effect sensor systems utilized in connection with synchronous AC motors and/or brushless DC motors, suffer from various deficiencies. For example, many prior Hall effect sensor systems for electric motors offered limited accuracy in regard to adjustment of the positioning a Hall effect sensor with respect to a component of a motor. For example, many prior Hall effect sensor systems for electric motors were unable to adjust the position of a Hall effect sensor in increments less than about 0.127 mm (0.005 inch). Yet other prior Hall effect sensor systems fail to reliably affix the Hall effect sensor in a desired location, resulting in inaccurate rotor position information arising from movement of the Hall effect sensor responsive to vibration, wear, and/or the like. Still others are unable to support motors having a large number of poles, for example more than 50 poles at least in part due to insufficient positioning accuracy and/or precision. Yet others are unable to support motors having a fine pole pitch, for example a pole pitch of no more than about 20 mm. Additionally, many prior torque sensing systems do not provide the ability to independently adjust the position of multiple Hall effect sensors while retaining the multiple Hall effect sensors in a single assembly.

In contrast, various problems associated with prior fall effect sensor systems can be reduced and/or eliminated via use of an adjustable Hall effect sensor system configured in accordance with principles of the present disclosure. For example, in various exemplary embodiments Hall effect sensors may be positioned with a high degree of mechanical precision and/or accuracy, for example within about 0.0254 mm (0.001 inches) of a desired location on a motor. Moreover, Hall effect sensors may be positioned with a high degree of electrical precision and/or accuracy (for example, within about 2 electrical degrees of a particular point in a voltage phase in a motor). Yet further, Hall effect sensors may be positioned with a high degree of performance precision and/or accuracy (for example, positioned to experience within 10% of the theoretical maximum Hall effect for a particular sensor configuration). Stated generally, Hall effect sensors may be placed in positions functionally equivalent to an ideal position, for example within one half an electrical degree of an ideal location on a motor having a fine pole pitch. Additionally, Hall effect sensors may be placed in a desired position on a motor having a fine pole pitch, for example a pole pitch no more than 10 mm, no more than 8 mm, no more than 6 mm and/or the like.

Because the Hall effect sensors may be positioned more precisely and/or accurately, the location of a rotor in an electrical machine (and/or the relative locations of a rotor and a stator in an electrical machine) may be more precisely and/or accurately determined. By utilizing improved rotor and/or stator positioning information, performance of electric motors, and more generally, performance of electric vehicles, may be modified, refined, and/or otherwise improved. For example, performance may be improved by better matching the electrical inputs of a motor controller to one or more desired rotational position(s) of a rotor in order to improve output torque, efficiency, operating RPM range, minimize torque ripple, and/or the like.

As used herein, an adjustable Hall effect sensor system may be any system configured to utilize the Hall effect to measure a desired real-world condition, for example a position of a permanent magnet with respect to a Hall effect sensor. Turning now to FIG. 1, in an exemplary embodiment an adjustable Hall effect sensor system 100 configured in accordance with principles of the present disclosure generally comprises a sensor component 110 and a sensor positioning component 130. Adjustable Hall effect sensor system 100 may be coupled to an electric motor 150, for example a synchronous AC motor, a brushless DC motor, a transverse flux machine, and/or the like. Moreover, adjustable Hall effect sensor system 100 may be integrated with and/or share one or more components with a motor 150. In various exemplary embodiments, motor 150 is coupled to a load 170, for example an electric vehicle, an appliance, and/or the like.

Sensor component 110 is configured to respond to, measure, and/or otherwise react to a desired real-world event, for example motion of a permanent magnet in an electric motor rotor. In various exemplary embodiments, sensor component 110 comprises one or more Hall effect sensors, voltage regulators, voltage generators, Schmitt triggers, amplifiers, microprocessors, and/or the like. In an exemplary embodiment, sensor component 110 comprises an A1125UA Hall effect sensor manufactured by Allegro Microsystems (Worcester, Mass.). In other exemplary embodiments, sensor component 110 comprises one or more of a Honeywell (Morristown, N.J.) SS461A Hall effect sensor, a Honeywell SS441A Hall effect sensor, or other suitable Honeywell SS400 series Hall effect sensor. Sensor component 110 may be configured to be utilized in a wired configuration; alternatively, sensor component 110 may be configured to utilize wireless communication. Moreover, positioning principles of the present disclosure may suitably be applied in connection with various sensors and electric motors and vehicles, and are not limited to Hall effect sensors.

Sensor positioning component 130 is configured to locate and/or support sensor component 110, for example locating sensor component 110 with respect to motor 150. Sensor positioning component 130 may also be configured to facilitate communication with sensor component 110, for example by providing electrical leads to sensor component 110. In various exemplary embodiments, sensor positioning component 130 comprises one or more of printed circuit boards, stamped or injection molded plastic bases, flexible printed circuits that may be bonded to a mechanical structure such as a plastic base, electrical traces, wires, mechanical fasteners, cams, gears, springs, portions of planar material, and/or any other suitable components, systems, and/or devices configured to facilitate positioning and/or support of sensor component 110.

Adjustable Hall effect sensor system 100 may be coupled to and/or comprise a portion of motor 150, for example a stator. Motor 150 may be configured to drive a load 170; alternatively, motor 150 may be configured to receive a driving force from load 170 and function as a generator.

Load 170 may comprise a vehicle. For example, load 170 may comprise an electric bicycle where motor assistance is provided when the rider is pedaling (a "pedelec"), an electric bicycle where motor assistance is provided via a throttle (an "e-bike"), a motorcycle, a scooter, an electric automobile, a hybrid automobile, a boat, an airplane, and/or any other suitable transportation device. Load 170 may also comprise an appliance, a power tool, industrial machinery, and/or any other suitable systems or devices capable of utilizing a rotary input force.

Through use of an adjustable Hall effect sensor system, for example adjustable Hall effect sensor system 100 in FIG. 1, various shortcomings of prior Hall effect sensor approaches and systems may be overcome. One or more Hall effect sensors may be positioned with an improved degree of desired precision and/or accuracy. Additionally, multiple Hall effect sensors may be jointly supported while retaining the ability to be independently repositioned and/or adjusted. Moreover, one or more Hall effect sensors may be fixed in position and less susceptible to drift responsive to vibration or other operating conditions. Battery power may be more effectively utilized in an electric vehicle by improved motor efficiency and/or performance, for example arising from improved matching of motor controller inputs to an electric motor. Motor torque output may be increased and operating noise and vibration may be reduced. Stated generally, application of principles of the present disclosure enables electric motors configured with improved performance, allowing for integration in a wider range of vehicles, appliances, and other electrical devices.

Figure 2A:
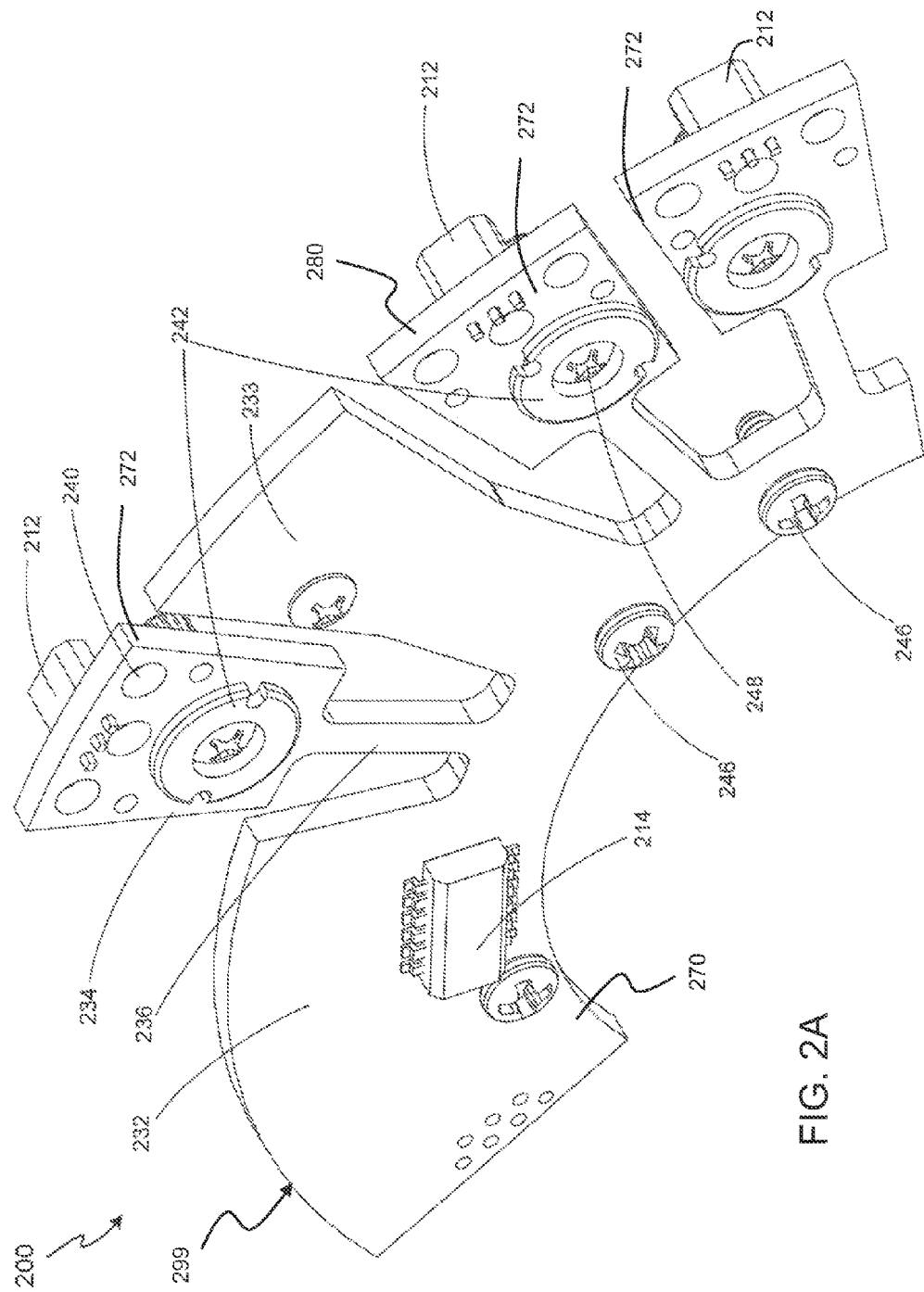
FIGS. 2A-2F illustrate isometric views of components of an exemplary adjustable Hall effect sensor system in accordance with an exemplary embodiment.
Figure 2B:
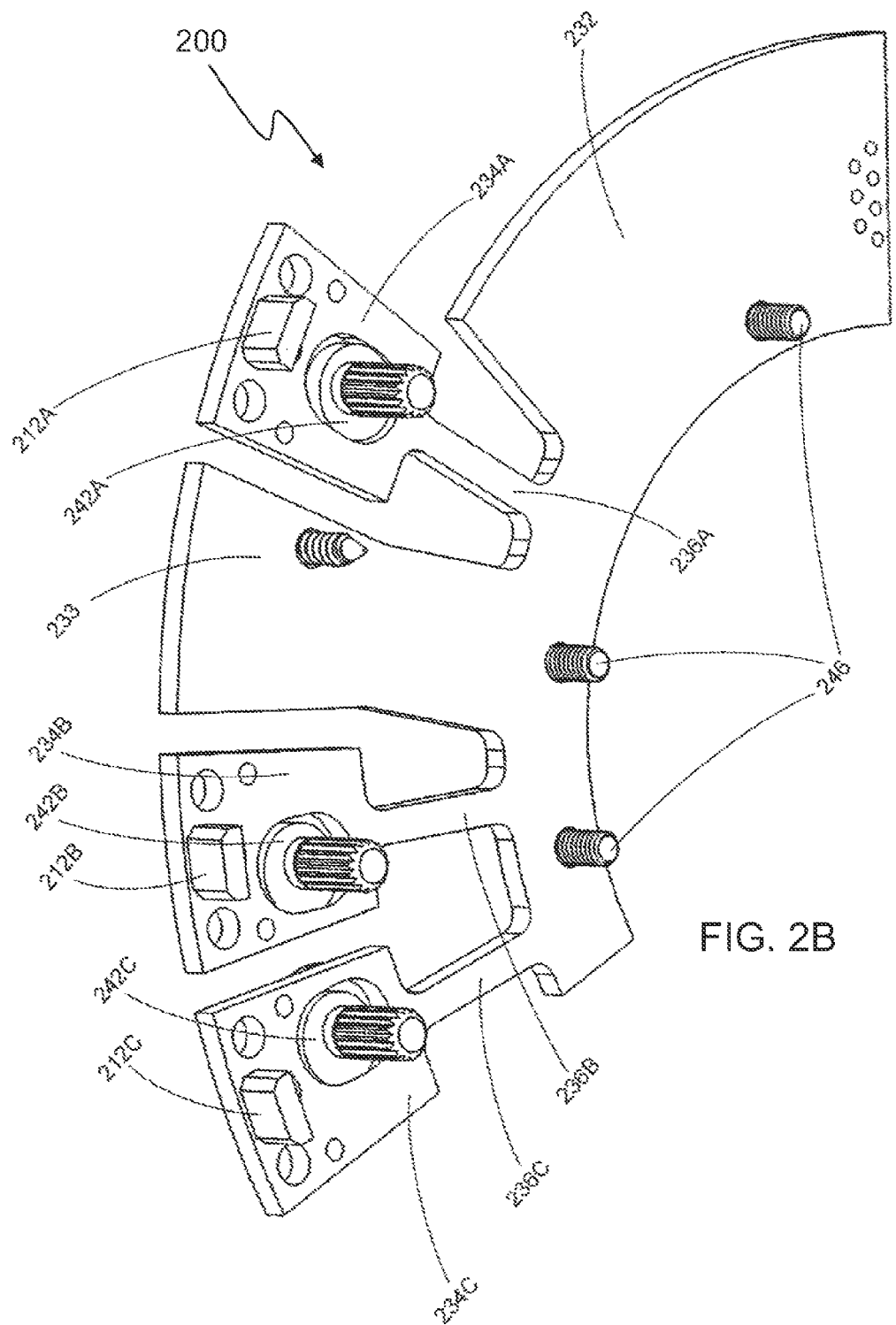
Figure 2C:
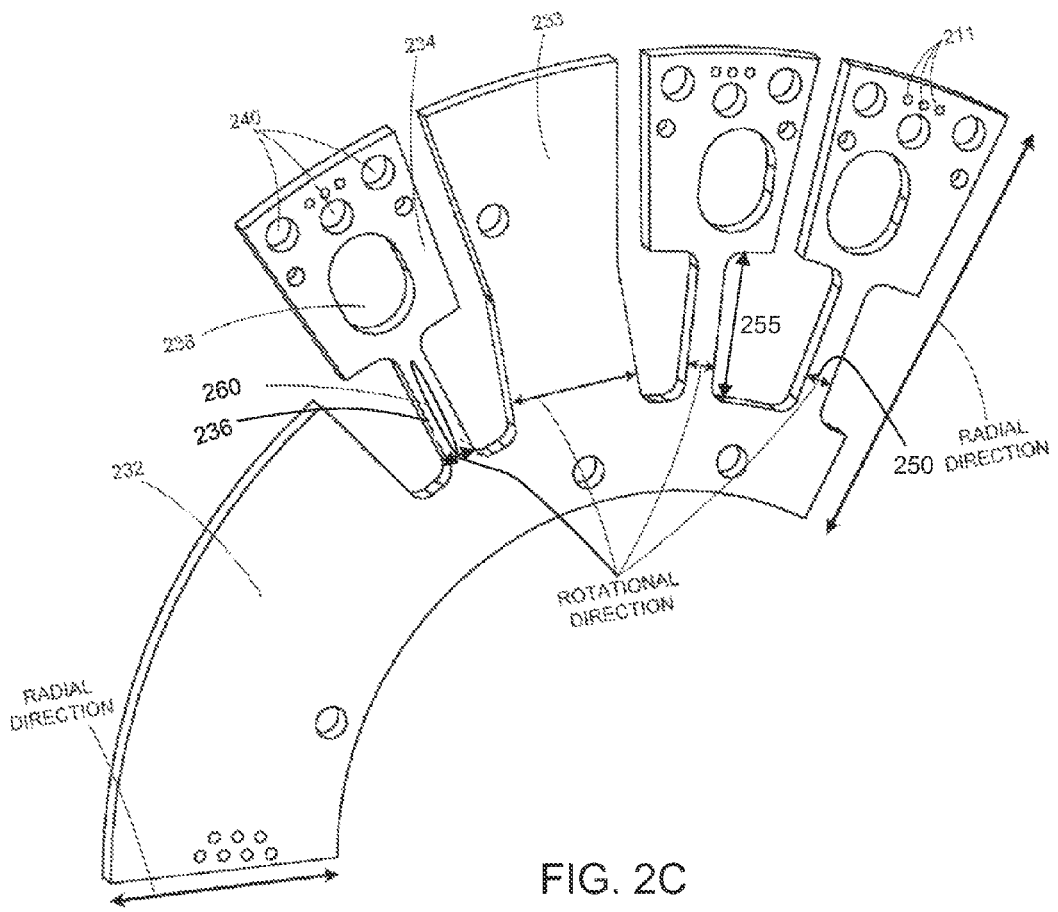

In an exemplary embodiment, and with reference now to FIGS. 2A-2F, an adjustable Hall effect sensor system 100, for example adjustable Hall effect sensor system 200, is configured for use with an electric motor. Adjustable Hall effect sensor system 200 comprises a printed circuit board (PCB) 232. The sensor positioning component 299, comprises a main body portion 270, and extended portions 272, comprising a generally "paddle" shaped portions 234, each coupled to the main body portion of PCB 232 via a neck 236. Note that the main body portion 270 and the extended portions 272 are all configured out of a single PCB 232, or are contiguous. A paddle 234, as used herein, is defined as an adjustable component 280 of the sensor positioning component 299 that is extended from and coupled to the main body by a neck 236 comprising an elongated member between the paddle and main body portion 270. In some embodiment, a paddle may be enlarged in dimension over the neck portion, as shown in FIGS. 2A-2C. Paddle 234 is configured with an aperture 238 therethrough. Cam 242 is disposed at least partially within aperture 238. A Hall effect sensor 212 is coupled to paddle 234.

The main body portion 270 of PCB 232 is affixed to a motor via one or more fasteners 246, for example in order to achieve rough positioning of one or more Hall effect sensors 212. Responsive to operation of cam 242, paddle 234 is displaced over a range, for example at least partially in a rotational direction of the motor, as shown in FIG. 2C. In this manner, while the rough positioning of Hall effect sensor 212 may be controlled via the dimensions of PCB 232 and the coupling of PCB 232 to a motor, fine positioning of Hall effect sensor 212 is achieved via operation of cam 242. Once Hall effect sensor 212 is in a desired position responsive to operation of cam 242, Hall effect sensor 212 may be secured in place via operation of fastener 246. A cam may be configured to provide any suitable displacement range, or positional adjustment of the Hall effect sensor, as described herein. For example a cam may be configured with a maximum displacement range of no more than about 5 mm, no more than about 3 mm, no more than about 2 mm, no more than about 1 mm, no more than about 0.5 mm.

In an exemplary embodiment, with reference now to FIG. 2A, PCB 232 is configured to locate and/or support one or more sensors, for example Hall effect sensors 212. PCB 232 is also configured to provide communicative connections to Hall effect sensors 212, for example via electrical traces within and/or on the surface of PCB 232. For example, Hall effect sensors 212 may be coupled to microprocessor 214 via electrical traces in PCB 232. In this manner, PCB 232 provides adjustable mechanical support and/or positioning of Hall effect sensors 212, while simultaneously providing electrical communication thereto.

In various exemplary embodiments, PCB 232 is configured to provide support and/or electrical connectivity to electrical components which are not a part of adjustable Hall effect sensor system 300, for example one or more instrumentation amplifiers, filters, thermal couples, analog to digital converters, microprocessors, and or the like. In an exemplary embodiment, PCB 232 provides support and electrical connectivity for one or more electrical components of a torque sensing system.

Figure 4:
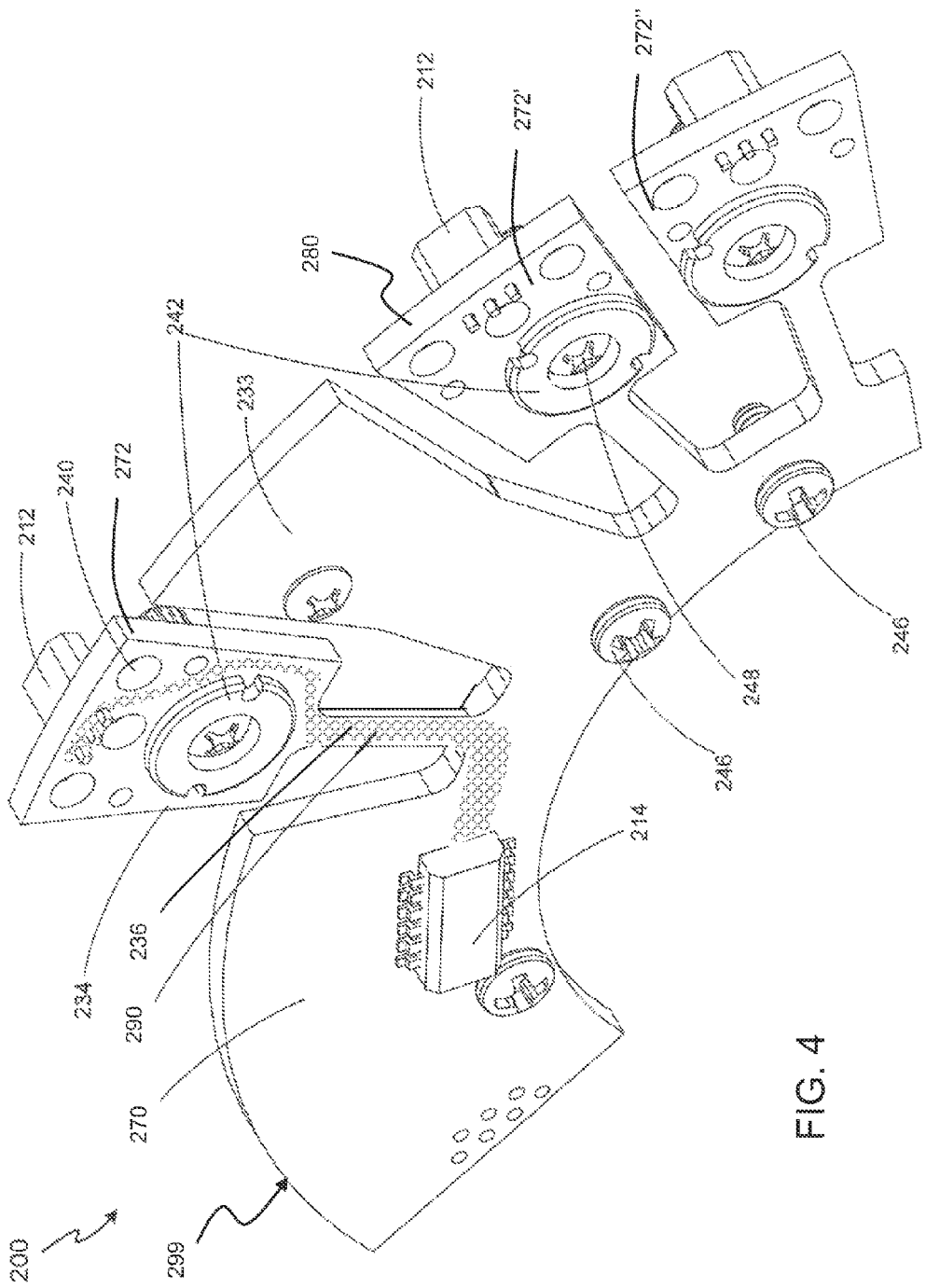
FIG. 4 is illustrates an isometric view of components of an exemplary adjustable Hall effect sensor system having a flexible circuit in accordance with an exemplary embodiment.

As shown in FIG. 4, an adjustable Hall effect sensor system described herein may comprise a flexible circuit 290 that may provide positional adjustment of a Hall effect sensor while providing electrical communication from the Hall effect sensor to a microprocessor 214, for example. A flexible circuit 290 may be a portion of an adjustable component 280, as described herein. A flexible circuit may be coupled between the main body and a Hall effect sensor, and may be supported along a portion of the flexible circuit material, such as being bonded to a plastic support material, for example. As shown in FIG. 4, the flexible circuit 290, may be attached to the main body 270 and a paddle 234, and may be unsupported between the main body and paddle to provide for flexible positional adjustment of the Hall effect sensor. As shown in FIG. 4, the flexible circuit 290 is attached to the main body 270 and paddle 272, but is not attached therebetween and comprises a portion of a neck 236. An adjustable component, as used herein, may be any component that may be displaced or adjusted in position without displacing or adjusting the position of the main body portion. An adjustable component may comprise any suitable number and configuration or components to allow for displacement of the Hall effect sensor.

In an exemplary embodiment, the main body portion 270, such as PCB 232, shown in FIG. 2A, is configured with extended portions 272, such as a paddle 234 extending from and coupled to the main body by a neck 236. Any number of extended portions may be configured on the sensor positioning component 299, including but not limited to one, two three or more, as desired. Likewise any number of paddles may be configured on extended portions, or coupled to the main body by a neck, including, but not limited to, one paddle, two paddles, three paddles, and/or more paddles, as desired. In some embodiments, a sensor positioning component may comprise an extended portion with paddle and at least one extension component without a paddle. Moreover, PCB 232 may also be configured with one or more flanges 233, for example in order to provide a desired level of structural stability to PCB 232 and/or provide additional mounting points for PCB 232 to be coupled to a motor.

The neck 236 may have be configured to provide any suitable rotational direction displacement 250 of a Hall effect sensor as shown in FIG. 2C, including but not limited to greater than about 0.5 mm, greater than about 1.0 mm, greater than about 5 mm, greater than about 10 mm, greater than about 15 mm, and any range between and including the rotational direction dimensions provided. In an exemplary embodiment, neck 236 has a rotational direction displacement 250 between about 1 mm in a rotational direction to about 10 mm in a rotational direction. Moreover, neck 236 may be configured with any suitable length 255 in a radial direction as shown in FIG. 2C, including, but not limited to, greater than about 2.5 mm, greater than about 5 mm, greater than about 10 mm, greater than about 20 mm, greater than about 50 mm, greater than about 100 mm, greater than about 150 mm, and any range between and including the lengths provided. Stated generally, neck 236 may be configured with any suitable lengths, widths, and/or thicknesses, as desired, in order to provide a desired amount of support and/or range of movement to paddle 234 and Hall effect sensor 212 coupled thereto. In an exemplary embodiment, neck 236 is an elongated member having a length 255 that is at least two times greater than the rotational direction dimension. Moreover, the dimensions of neck 236 may vary at least in part due to a particular thickness of PCB 232. The neck may have any suitable geometry, including curved geometry, for example, wherein the width of the neck changes along the length of the neck. In one embodiment, then neck is wider at the ends where it is coupled to the main body and a paddle, and thinner in the middle between the ends.

In various exemplary embodiments, neck 236 may be configured with one or more openings 260, including but not limited to slots, holes, trenches, cutouts, and/or other similar geometric features, in order to achieve a desired level of flexibility in neck 236 while retaining a desired level of structural integrity in neck 236. In an exemplary embodiment, neck 236 is configured with at least one slot therethrough, such as a rectangular or oval slot 260, as shown in FIG. 2C. The slot extends at least partway along neck 236 in a radial direction, giving neck 236 a shape resembling a pair of parallel beams. Moreover, in various exemplary embodiments PCB 232 may be configured with one or more openings, including but not limited to slots, holes, trenches, cutouts, and/or other similar geometric features near the area where neck 236 joins the main portion of PCB 232, for example in order to provide strain relief. In this manner, neck 236 may be permitted to bend and/or flex over a wider range without structural damage to the substrate forming PCB 232 and/or electrical pathways therein.

Figure 2D:
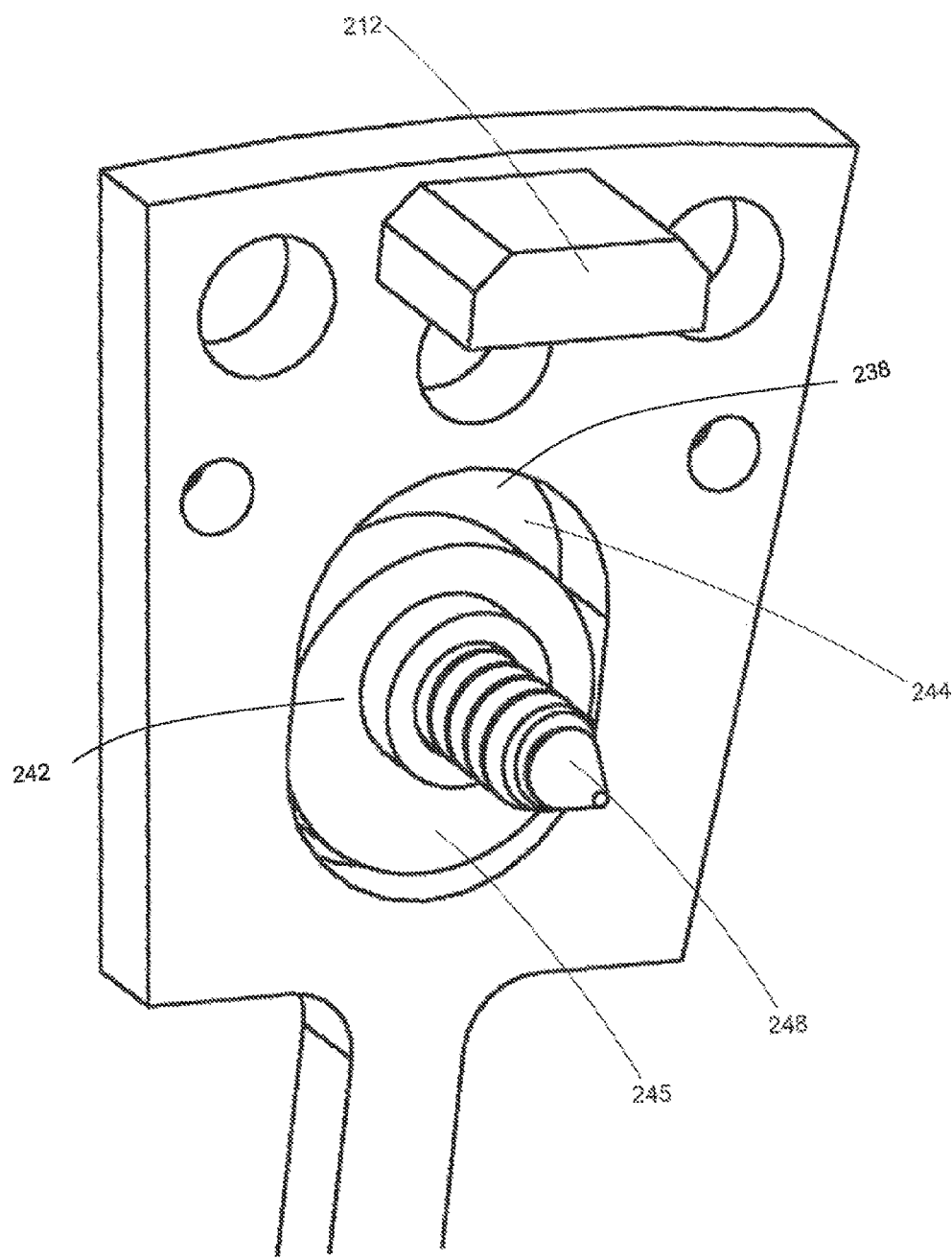

Continuing to reference FIGS. 2C and 2D, in various exemplary embodiments paddle 234 is configured with aperture 238 therethrough. Aperture 238 is configured to admit at least a portion of cam 242, for example eccentric lobe 245. Aperture 238 is also configured to cause paddle 234 to act as a cam follower. Therefore, aperture 238 may be at least partially rectangular, ovoid, rounded, and/or otherwise configured and or shaped to receive at least a portion of cam 242. Aperture 238 is also configured and/or shaped to facilitate movement of paddle 234 responsive to operation of cam 242. In an exemplary embodiment illustrated in FIG. 2C, aperture 238 is configured with generally semicircular ends, with each end forming about half a circle. The semicircular ends are separated from one another by parallel linear sides, resulting in a somewhat ovoid overall shape. Described differently, aperture 238 is configured as a rectangle having extensively rounded corners. The arcs of the rounded corners closest one another on the rectangle share a common center point, so the rounded corners closest one another on the rectangle form a half-circle. Moreover, aperture 238 may be configured with at least one displacement geometry feature, or any suitable dimensions, angles, curves, and/or the like in order to cause paddle 234 to be displaced responsive to operation of cam 242.

Paddle 234 may be configured with openings, for example holes 211 to facilitate coupling of Hall effect sensor 212 to paddle 234. Paddle 234 may also be configured with one or more glue ports 240 to enable an adhesive to be applied on and/or near Hall effect sensor 212, for example after Hall effect sensor 212 has been positioned in a desired location responsive to operation of cam 242.

Figure 2E:
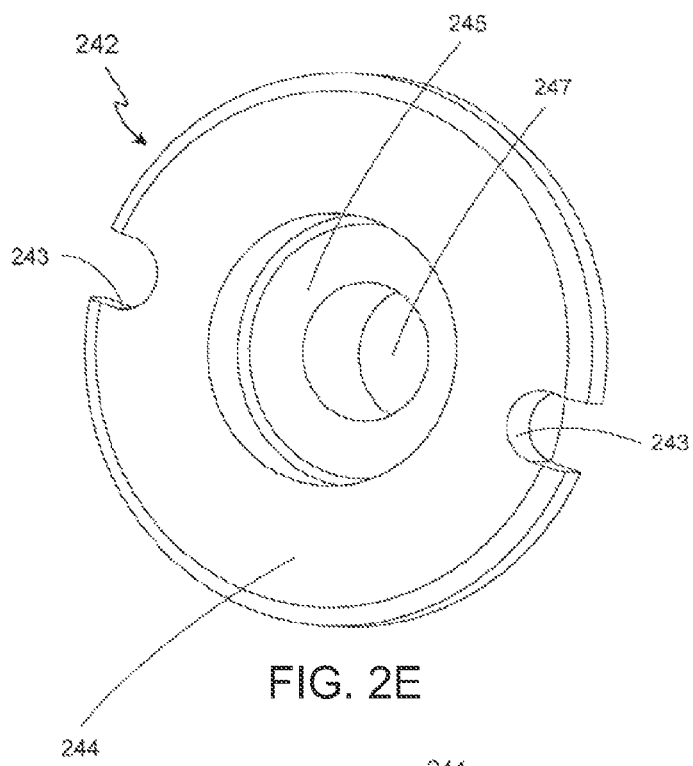
Figure 2F:
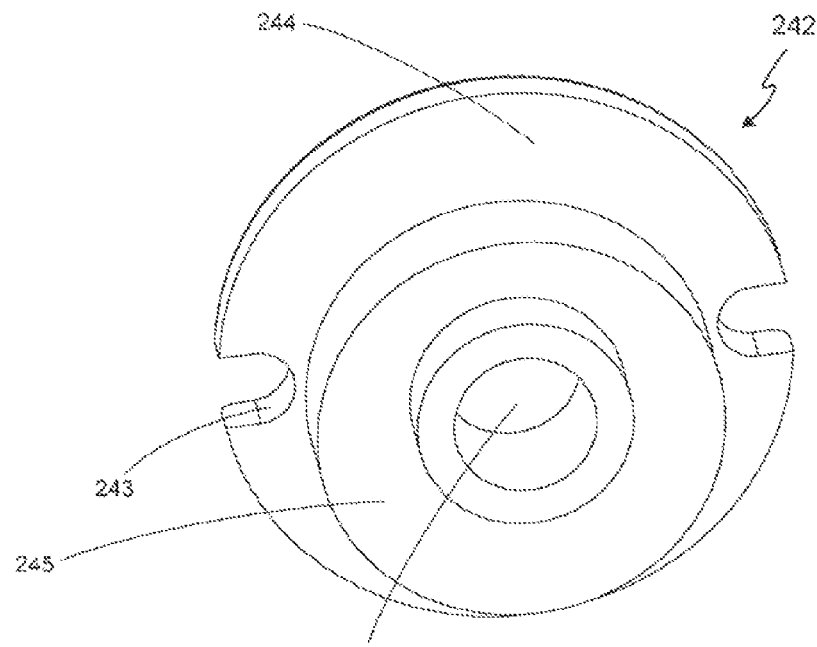

With reference now to FIGS. 2D through 2F, in various exemplary embodiments cam 242 comprises one or more components configured to provide mechanical and/or electromechanical adjustability of a position of paddle 234 and/or Hall effect sensor 212. In an exemplary embodiment, cam 242 comprises a first generally circular lobe 244 having at least one notch 243 disposed on the edge thereof. Cam 242 may further comprise an eccentric lobe 245 extending from circular lobe 244. Hole 247 passes through circular lobe 244 and eccentric lobe 245. Circular lobe 244 and eccentric lobe 245 are rotatable about an axis passing through the center of hole 247; however, circular lobe 244 and eccentric lobe 245 do not share a common center point. Stated another way, hole 247 is centered about the center of circular lobe 244, but not centered about the center of eccentric lobe 245.

When coupled to paddle 234, eccentric lobe 245 extends into aperture 238. Circular lobe 244 has a diameter greater than a width of aperture 238, so circular lobe 244 abuts a surface of paddle 234 without extending into aperture 238. In this configuration, responsive to rotation of cam 242, eccentric lobe 245 exerts a varying force against a sidewall of aperture 238. Responsive to the force, paddle 234 acts as a follower of cam 242. Paddle 234 may thus be displaced in a desired direction, for example in a rotational direction of a motor. Rotation of cam 242 in opposite directions results in displacement of paddle 234 in opposing directions. Paddle 234 may be displaced over a bounded range without decoupling from the remainder of PCB 232 due to the flexibility provided by neck 236.

In an exemplary embodiment, cam 242 is rotatable responsive to a force exerted on cam 242 via notches 243, for example due to rotation of a cam tool engaged in notches 243. Moreover, cam 242 may be rotated via any suitable method, tool, and/or apparatus, as desired. For example, cam 242 may be rotated via a cam tool driven by a stepper motor, in order to rotate cam 242 in small increments. Any suitable external tool may be used to adjust the cam, including robotic or otherwise mechanically controlled coupling and adjustment tools. For example, a plurality of cams may be adjusted by coupling to an automated tool that is capable of very fine adjustments. The automated tool may comprise a computer interface that determines and controls the amount of Hall effect displacement adjustment in response to data collected, such as from the microprocessor on the Hall effect sensor system.

In an exemplary embodiment, responsive to operation of cam 242, paddle 234 may be displaced a distance of up to about 1.5 mm (0.0591 inches) in a rotational direction of a motor. In other exemplary embodiments, responsive to operation of cam 242, paddle 234 may be displaced a distance of up to about 0.5 mm (0.0591 inches) in a rotational direction of a motor. Moreover, based at least on the configuration of cam 242, aperture 238, and/or neck 236, paddle 234 and/or Hall effect sensor 212 may be configured to be displaced any suitable distance responsive to operation of cam 242, as desired. For example, lengthening and/or thinning of neck 236 may generally result in an increased range of displacement for paddle 234. In this manner, Hall effect sensor 212 may be placed at a desired location, for example at a particular location with respect to a rotor of an electrical machine.

In various exemplary embodiments, paddle 234 and/or Hall effect sensor 212 may be incrementally displaced responsive to operation of cam 242. Moreover, paddle 234 and/or Hall effect sensor 212 may be displaced with a high degree of precision and/or accuracy. For example, in an exemplary embodiment, responsive to operation of cam 242, paddle 234 may be displaced in increments as small as 0.0254 mm (0.001 inches). Moreover, with respect to a change in alignment of Hall effect sensor 212 with respect to an electrical waveform in an electric motor, paddle 234 may be displaced in an amount resulting in a change of no more than 1 degrees of phase angle for Hall sensor 212.

While described above as a "cam" operable to move a "follower" responsive to rotation of the cam, in various exemplary embodiments cam 242 may comprise a spring, a lever, a worm gear, a wedge, a set screw, an external positioning tool, a, and/or other suitable components or combinations of components configured to modify a position of paddle 234.

In various exemplary embodiments, cam 242 may be adjusted and/or rotated when a motor is not rotating. Additionally, in various exemplary embodiments, cam 242 may be adjusted during operation of a motor. For example, an oscilloscope or other suitable tools and/or electrical components may be utilized to monitor an output of Hall effect sensor 212 responsive to rotation of a rotor. Cam 242 may be adjusted to move Hall effect sensor 212, and the resulting changes in the output of Hall effect sensor 212, for example changes in signal phase and/or amplitude, may be utilized to guide and/or inform further operation of cam 242 until a desired location is reached.

In various exemplary embodiments, hole 247 in cam 242 is configured to admit a fastener, for example fastener 246. Once paddle 234 and/or Hall sensor 212 are positioned in a desired location responsive to operation of cam 242, fastener 246 may be tightened and/or otherwise engaged in order to fix cam 242, paddle 234, and Hall effect sensor 212 in place. If paddle 234 and/or Hall effect sensor 212 are desired to be repositioned, fastener 238 may be at least partially loosened and/or disengaged in order to permit rotation of cam 242.

In an exemplary embodiment, after engagement of fastener 246, due to the distance between Hall effect sensor 212 and fastener 246, Hall effect sensor 212 may still be vulnerable to some undesired movement, for example due to flexibility and/or "play" in the structure of paddle 234. Accordingly, after positioning with cam 242, Hall effect sensor 212 may be affixed in a desired location via application of an adhesive. In an exemplary embodiment, Hall effect sensor 212 is affixed via an epoxy applied through one or more glue ports 240. Moreover, Hall effect sensor 212 may be secured via any suitable adhesive, glue, and/or bonding materials or compounds, as desired. In this manner, Hall effect sensor 212 may be permanently affixed in a chosen location.

In various exemplary embodiments, with reference again to FIGS. 2A-2F, adjustable Hall effect sensor system 200 is configured to permit multiple Hall effect sensors 212 to be independently positioned while being retained in a common assembly. Stated another way, Hall effect sensor 212A may be positioned without effecting the position of Hall effect sensors 212B and/or 212C. Moreover, Hall effect sensor 212A may be moved relative to Hall effect sensors 212B and/or 212C even though each are affixed to the same structure (e.g., printed circuit board). In an exemplary embodiment, positioning of Hall effect sensor 212A is achieved via operation of cam 242A, and facilitated by the flexibility provided by neck 236A. Positioning of Hall effect sensors 212B and 212C are achieved via operation of cams 242B and 242C, respectively, and facilitated by the flexibility provided by necks 236B and 236C, respectively.

Because PCB 232 is fixed in place via fasteners 246, and because the material comprising PCB 232 is configured to be at least partially flexible and/or deformable, paddle 234A can be displaced a limited distance without displacing either paddle 234B or paddle 234C. Accordingly, the placement of Hall effect sensor 212A can be adjusted without affecting the placement of Hall effect sensor 212B or Hall effect sensor 212C. Stated generally, in various exemplary embodiments adjustable Hall effect sensor system 200 provides for common retention and support of multiple Hall effect sensors 212 while simultaneously providing independent adjustable positioning for each Hall effect sensor 212 in adjustable Hall effect sensor system 200. Additionally, in various exemplary embodiments adjustable Hall effect sensor system 200 provides simultaneous electrical connections to multiple Hall effect sensors, 212 while also providing independent adjustable positioning for each Hall effect sensor 212 in adjustable Hall effect sensor system 200. Moreover, adjustable Hall effect sensor system 200 may be quickly and easily coupled to a motor and then tuned via adjustment of the positioning of one or more Hall effect sensors 212, facilitating improved motor performance, increased speed of motor assembly, and reduced component expense.

Figure 5:
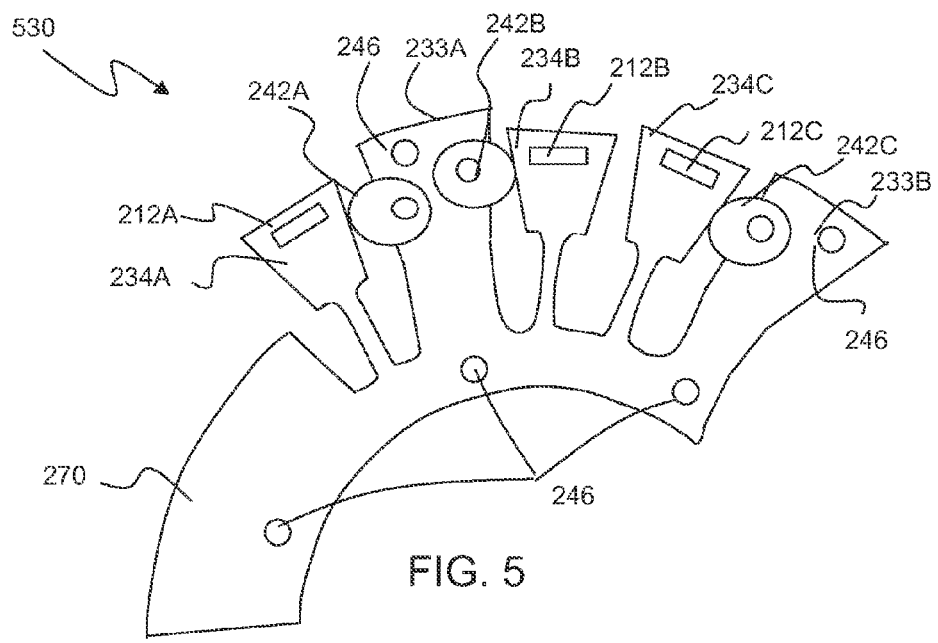
FIG. 5 illustrates a front view of an exemplary sensor positioning component of a Hall effect sensor system in accordance with an exemplary embodiment.

The adjustable Hall effect sensor positioning component 130, may have any suitable number and configuration of adjustable components. As shown in FIG. 5, a sensor positioning component 530 comprises a main body 270, three paddles 234, and two flanges 233. The paddles 234 and the Hall effect sensors 212 coupled thereto, may be adjusted by turning an associated cam 242 configured to displace the paddle. For example, cam 242A may be turned to adjust the position of paddle 234A. Likewise, cam 242B may be turned to adjust the position of paddle 234B, and so on. As shown in FIG. 5, a flange may comprise one or more fasteners 246 to secure the position of the flange to the motor or other electrical device coupled thereto.

Figure 6:
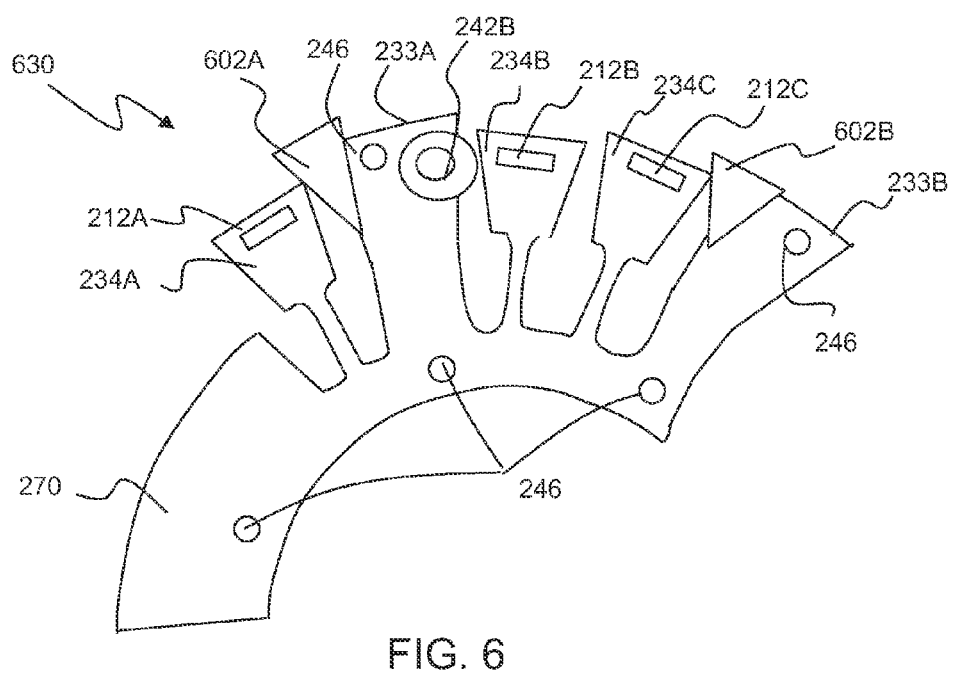
FIG. 6 illustrates a front view of an exemplary sensor positioning component of a Hall effect sensor system in accordance with an exemplary embodiment.

As shown in FIG. 6, a slidable component 602 such as a wedge, may be configured to adjust the position of a Hall effect sensor. For example, the slidable component 602A may be slid down the flange 233A to adjust the position of the paddle 234A and the Hall effect sensor 212A coupled thereto. A slideable component may be configured on a flange or an extended portion. Any number of different type and combination of adjustment components be configured on a sensor positioning component.

Figure 7:
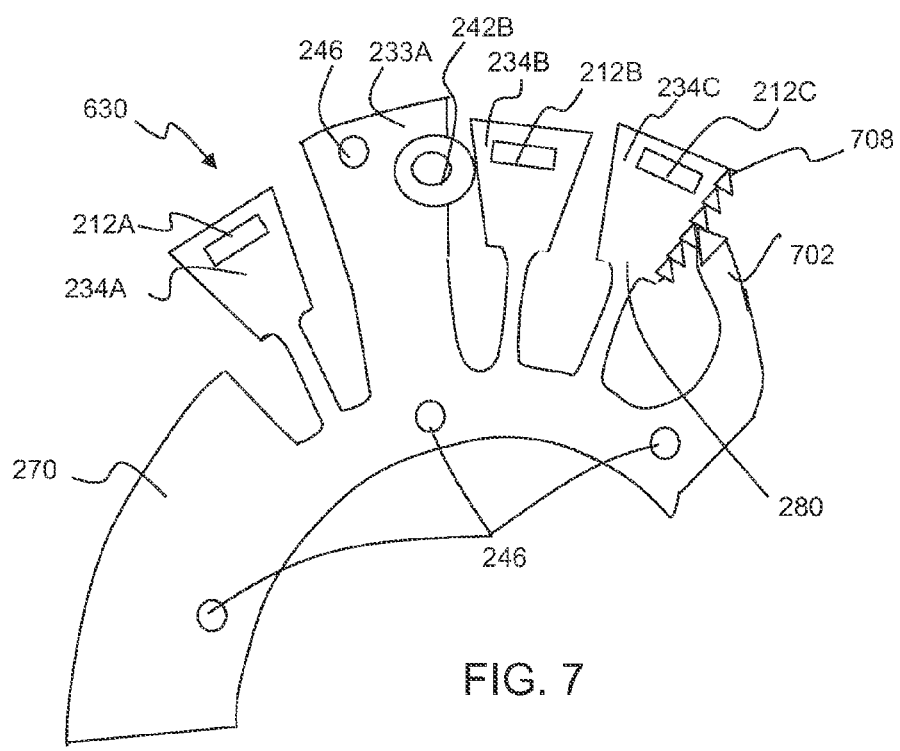
FIG. 7 illustrates a front view of an exemplary sensor positioning component of a Hall effect sensor system in accordance with an exemplary embodiment.

As shown in FIG. 7, a displacement component 702 may be configured to contact and adjust the position of an adjustable component 280. The displacement component 702, or the extension from the main body portion 270, is configured to flex and move along a surface of the paddle 234C. The surface of the paddle is configured with a toothed surface 708, thereby allowing the displacement component 702 to securely maintain a position along the surface of the paddle. The displacement component and/or an adjustable component 280 may be configured with a surface to allow for incremental adjustment of the position of the Hall effect sensor. A displacement component may be any component that is coupled to the main board, and may comprise a pivot point for moving the adjustable component. A slideable component 602, as described herein, may be a type of displacement component.

Figure 8:
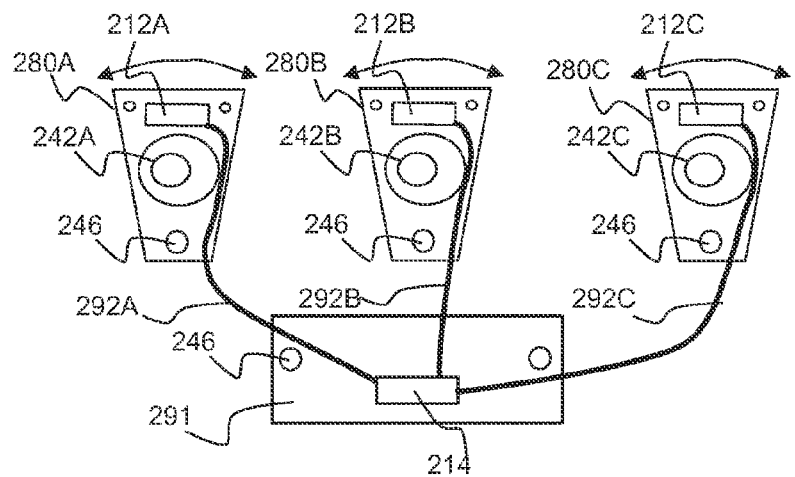
FIG. 8 illustrates a front view of an exemplary sensor positioning component of a Hall effect sensor system in accordance with an exemplary embodiment.

In yet another embodiment as shown in FIG. 8, three Hall effect sensors are coupled to three individual and discrete adjustable components 280A, 280B, and 280C. Each of the adjustable components comprises an adjustment component, such as a cam, as described herein, that may provide positional adjustment of the Hall effect sensor, as indicated by the line with arrow on either end, just above the adjustable components 280. The discrete adjustable components may have wireless communication with an electronic device, or may have electrical leads 292 that are connected to a common element 291, such as a main body portion, that is attached to the electrical device. A microprocessor 214 may be coupled to the common element 291, as shown in FIG. 8. In another embodiment, the electrical leads may be attached to an electrical device or microprocessor that is not attached to the electrical device. Any number of discrete adjustable components may be coupled to an electrical device including, but not limited to, one, two, three or more and the like.

Hall effect sensors 212 may be coupled to a motor controller, an oscilloscope, a bike computer, or other electronic components, as desired. Hall effect sensors 212 may be coupled by wires; alternatively, wireless communication may be utilized. The output of one or more Hall effect sensors 212 may be utilized (for example, via hardware and/or software processing) to calculate, assess, estimate, track, and/or monitor a desired condition, for example a position of a rotor with respect to a stator in an electrical machine.

Additional sensors may be utilized as part of adjustable Hall effect sensor system 200, as suitable. For example, temperature sensors may be utilized in order to account for changes in various material properties and/or positions (e.g., expansion and/or contraction due to thermal changes responsive to operation of a motor).

Figure 3A:
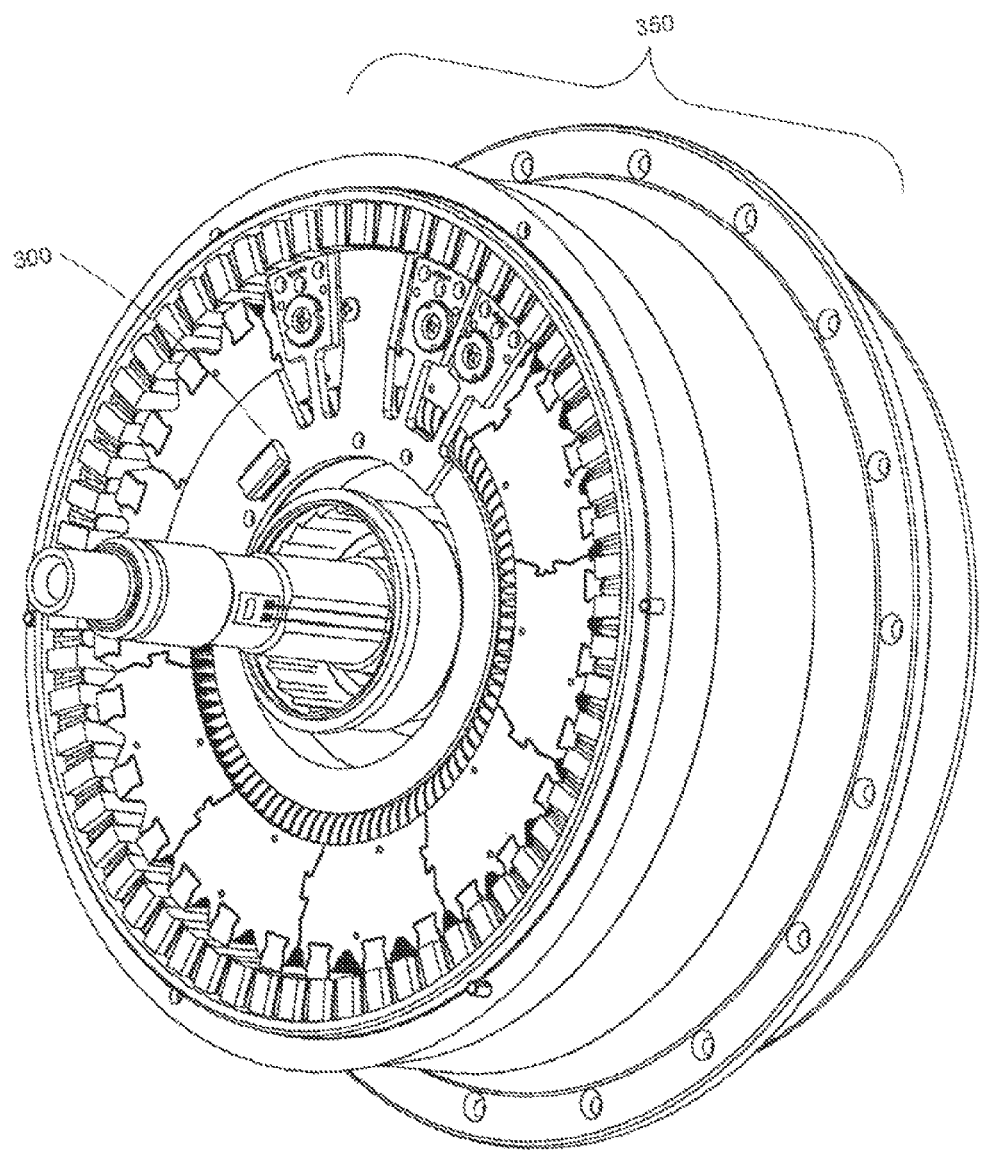
Figure 3B:
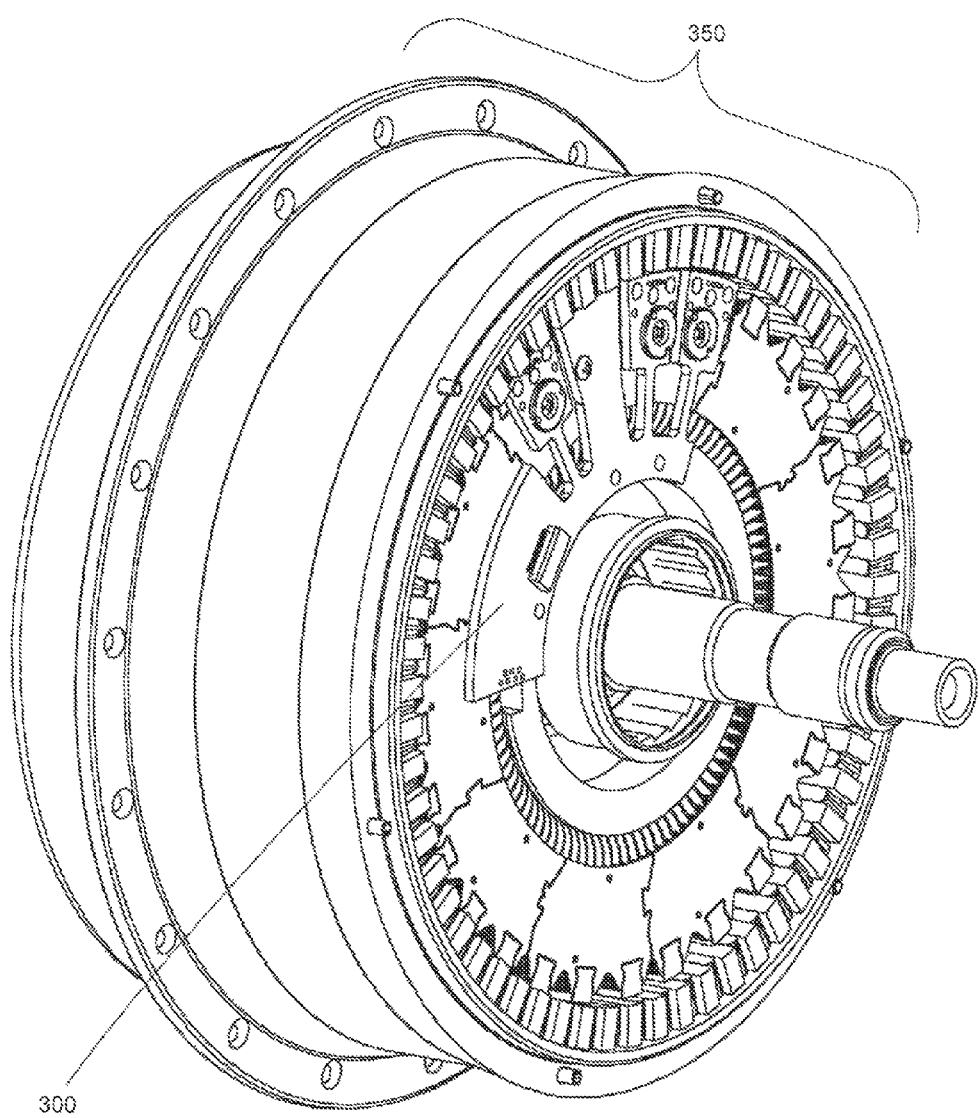

Turning now to FIGS. 3A through 3C, in various exemplary embodiments an adjustable Hall effect sensor system 100, for example adjustable Hall effect sensor system 300, is coupled to a motor 150, for example transverse flux machine 350. In other exemplary embodiments, adjustable Hall effect sensor system 300 is coupled to a radial flux synchronous AC electric motor. Moreover, adjustable Hall effect sensor system 300 may be coupled to and/or utilized with any suitable electric motor and/or generator, as desired. Additional details regarding exemplary transverse flux machines and/or commutated flux machines suitable for use with exemplary adjustable Hall effect sensor systems configured in accordance with principles of the present disclosure may be found in U.S. Provisional Patent Application Ser. No. 61/414,769 filed Nov. 17, 2010 and entitled "TRANSVERSE AND/OR COMMUTATED FLUX SYSTEMS HAVING SEGMENTED STATOR LAMINATIONS", U.S. Provisional Patent Application Ser. No. 61/414,774 filed Nov. 17, 2010 and entitled "TRANSVERSE AND/OR COMMUTATED FLUX SYSTEM COIL CONCEPTS", and U.S. Provisional Patent Application Ser. No. 61/414,781 filed Nov. 17, 2010 and entitled "TRANSVERSE AND/OR COMMUTATED FLUX SYSTEMS HAVING LAMINATED AND POWDERED METAL PORTIONS". The contents of the all the foregoing applications are hereby incorporated by reference in their entirety.

Transverse flux machine 350 may be configured with a single motor phase. Alternatively, transverse flux machine 350 may be configured as a polyphase device, for example configured with two motor phases, three motor phases, and/or the like. In various exemplary embodiments, transverse flux machine 350 is configured with a high pole count, for example at least 50 poles per motor phase. In an exemplary embodiment, transverse flux machine 350 is configured with 60 poles per motor phase. In another exemplary embodiment, transverse flux machine 350 is configured with 80 poles per motor phase. Moreover, transverse flux machine 350 may be configured with any suitable number of motor poles, for example in order to achieve one or more desired performance characteristics of transverse flux machine 350. Stated generally, adjustable Hall effect sensor system 300 is particularly well suited for application with motors having a high pole count, as the high pole count demands significant accuracy and/or precision in the placement of one or more Hall effect sensors, due at least in part to the reduced spacing between poles when compared to motors having lower pole counts.

In certain exemplary embodiments, transverse flux machine 350 is configured with a compact diameter at the air gap, for example a diameter no more than 35.56 centimeters (14 inches). In other exemplary embodiments, transverse flux machine 350 is configured with a diameter at the air gap of no more than 17.78 centimeters (7 inches). In an exemplary embodiment, transverse flux machine 350 is configured with a diameter at the air gap of about 10.8 centimeters (4.25 inches). Moreover, in various exemplary embodiments transverse flux machine 350 may be configured with a diameter at the air gap as small as about 40 mm (1.57 inches). Stated generally, adjustable Hall effect sensor system 300 is particularly well suited for application with motors having a compact diameter in connection with a high pole count, for example a pole count as high as 50 poles, 60 poles, 80 poles, 100 poles, and/or more poles. This is because the compact diameter and high pole count demands significant accuracy and/or precision in the placement of one or more Hall effect sensors, due at least in part to the reduced motor size and consequent reduced size of and/or spacing between components when compared to motors having larger diameters and/or lower pole counts.

In various exemplary embodiments, transverse flux machine 350 is configured with both a compact diameter and a high pole count. In an exemplary embodiment, transverse flux machine 350 is configured with a pole count of 60 poles per motor phase and a diameter of about 10.8 centimeters (4.25 inches) at the air gap. In another exemplary embodiment, transverse flux machine 350 is configured with a pole count of 50 poles per motor phase and a diameter of about 10.16 centimeters (4 inches) at the air gap. Moreover transverse flux machine 350 may be configured with any suitable combination of pole count and motor diameter, as desired.

With specific reference now to FIG. 3C, in an exemplary embodiment adjustable Hall effect sensor system 300 may be utilized to position one or more Hall effect sensors 312 with respect to a rotor 351 of transverse flux machine 350. For example, via operation of cam 342, paddle 334 is displaced in order to align Hall effect sensor 312 at a particular location with respect to a magnet 354 and/or flux concentrator 352 in rotor 351. After positioning, epoxy may be administered via one or more glue ports 340 in order to affix paddle 334 and/or Hall effect sensor 312 to a portion of stator 361. In this manner, adjustable Hall effect sensor system 300 may be permanently coupled to stator 361.

Various of the foregoing exemplary embodiments have been disclosed with use of Hall effect sensors. In various other exemplary embodiments, alternative sensing components may be utilized, for example sensing components configured to benefit from improved accuracy and/or precision of alignment and/or positioning with respect to components of an electric motor or generator. Additionally, more than one of the same kind of sensor may be utilized, for example in order to provide error correction, calibration, increased signal to noise ratios, and/or the like.

In various exemplary embodiments, adjustable Hall effect sensor system 100 is configured to be removable and/or replaceable. For example, in one exemplary embodiment adjustable Hall effect sensor system 100 or components thereof are configured to be disconnected from a motor, for example by unthreading various retaining fasteners. A replacement adjustable Hall effect sensor system 100 or components thereof may then be installed. In other exemplary embodiments, adjustable Hall effect sensor system 100 is configured to be permanently affixed to a portion of a motor, for example via an epoxy bond to a stator.

While the principles of this disclosure have been shown in various embodiments, many modifications of structure, arrangements, proportions, the elements, materials and components, used in practice, which are particularly adapted for a specific environment and operating requirements may be used without departing from the principles and scope of this disclosure. These and other changes or modifications are intended to be included within the scope of the present disclosure.

The present disclosure has been described with reference to various embodiments. However, one of ordinary skill in the art appreciates that various modifications and changes can be made without departing from the scope of the present disclosure. Accordingly, the specification is to be regarded in an illustrative rather than a restrictive sense, and all such modifications are intended to be included within the scope of the present disclosure. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element. As used herein, the terms "comprises," "comprising," or any other variation thereof are intended to cover a non-exclusive inclusion, such that a process, method, article, or apparatus that comprises a list of elements does not include only those elements but may include other elements not expressly listed or inherent to such process, method, article, or apparatus. Also, as used herein, the terms "coupled," "coupling," or any other variation thereof, are intended to cover a physical connection, an electrical connection, a magnetic connection, an optical connection, a communicative connection, a functional connection, and/or any other connection.

What is claimed is:

1. An independently adjustable Hall effect sensor system, comprising:
    a sensor positioning component comprising:
        a main body portion;
        a first extended portion coupled to the main body portion by a first neck having a length that is at least twice a width dimension;
        a first Hall effect sensor attached to the first extended portion;
        a first adjustment component configured to displace said first extended portion;
        a second extended portion coupled to the main body portion by a second neck having a length that is at least twice a width dimension; and
        a second Hall effect sensor attached to the second extended portion,
        a second adjustment component configured to displace said second extended portion;
    wherein the independently adjustable Hall effect sensor system is configured for independently positioning each of said first and second Hall effect sensors, whereby displacement of the second Hall effect sensor by said second adjustment component does not affect the position of said first extended portion or said first Hall effect sensor and whereby displacement of the first Hall effect sensor by said first adjustment component does not affect the position of said second extended portion or said second Hall effect sensor.

2. The independently adjustable Hall effect sensor system of claim 1, wherein the sensor positioning component comprises a printed circuit board.

3. The independently adjustable Hall effect sensor system of claim 1, wherein the main body, the first and second necks and the first and second extended portions consist essentially of a printed circuit board.

4. The independently adjustable Hail effect sensor system of claim 1, wherein the sensor positioning component comprises a flexible circuit.

5. The independently adjustable Hall effect sensor system of claim 1, wherein at least one of the first or second adjustment components is a cam.

6. The independently adjustable Hall effect sensor system of claim 5, wherein the cam comprises:
    at least one notch;
    a circular lobe; and
    an eccentric lobe,
whereby rotation of the cam adjusts a position of one of said first or second Hall effect sensor.

7. The independently adjustable Hall effect sensor system of claim 5, wherein the cam is configured to adjust a position of the first Hall sensor in an increment of no more than 0.05 mm in a rotational direction.

8. The independently adjustable Hall effect sensor system of claim 5, wherein the cam is configured to adjust a position of the first Hall sensor a maximum displacement range of no more than 2 mm.

9. The independently adjustable Hall effect sensor system of claim 1, wherein at least one of the first of second extended portions is a paddle.

10. The independently adjustable Hall effect sensor system of claim 1, wherein at least one of the first or second extended portions comprises an aperture wherein the cam is configured at least partially therein.

11. The adjustable Hall effect sensor system of claim 9, wherein the extended portion, the main body and the neck are configured out of a single piece of material.

12. The independently adjustable Hall effect sensor system of claim 1, further comprising at least one flange, and at least one cam configured on the flange, whereby at least one of the first or second Hall effect sensors may be adjusted in position by turning the cam.

13. The independently adjustable Hall effect sensor system of claim 1, wherein a sensor positioning component further comprises:
    a third extended portion coupled to the main body portion by a third neck having a length that is at least twice a width dimension;
    a third Hall effect sensor attached to the third extended portion;
    a third adjustment component configured to displace said third extended portion; and
    wherein displacement of the third Hall effect sensor by said third adjustment component does not affect the position of the first or second Hall effect sensors.

14. The independently adjustable Hall effect sensor system of claim 1, wherein the independently adjustable Hall effect sensor system is coupled to a motor, and wherein the motor is configured with greater than 50 poles.

15. The independently adjustable Hall effect sensor system of claim 14, wherein the motor is configured with pole pitch no more than 6 mm.

16. An independently adjustable Hall effect sensor system, comprising:
   a sensor positioning component comprising:
   a main body portion;
   a first extended portion coupled to the main body portion,
   a first Hall effect sensor coupled to the first extended portion;
   a first cam coupled to the first extended portion;
   a second extended portion coupled to the main body portion;
   a second Hall effect sensor coupled to the second extended portion; and
   a second cam coupled to the second extended portion,
   wherein the independently adjustable Hall effect sensor system is configured for independently positioning each of said first and second Hall effect sensor, wherein rotation of the first cam adjusts a position of the first Hall effect sensor without displacing said second Hall effect sensor and wherein rotation of the second cam adjusts a position of the second Hall effect sensor without displacing said first Hall effect sensor.

17. The independently adjustable Hall effect sensor system of claim 16, wherein the main body and extended portions consist essentially of a printed circuit board.

18. The independently adjustable Hall effect sensor system of claim 16, wherein the extended portion comprises a paddle coupled to the main body portion by a neck having a length that is at least twice a width dimension.

19. The independently adjustable Hall effect sensor system of claim 16, wherein the sensor positioning component further comprises:
   a third extended portion coupled to the main body portion;
   a third Hall effect sensor coupled to the third extended portion; and
   a third cam coupled to the third extended portion,
   wherein rotation of said third cam adjusts a position of the third Hall effect sensor without displacing said the first or second Hall effect sensors.

20. An independently adjustable Hall effect sensor system, comprising:
   a sensor positioning component comprising:
   a first adjustable component coupled to a stator having a first aperture;
   a first Hall effect sensor coupled to the first adjustable component;
   a first cam attached to the first adjustable component and configured at least partially within said first aperture;
   a second adjustable component coupled to the stator having a second aperture; and
   a second Hall effect sensor coupled to the second adjustable component; and
   a second cam attached to the second adjustable component and configured at least partially within said second aperture;
   wherein the independently adjustable Hall effect sensor system is configured for independently positioning each of said first and second Hall effect sensors, whereby rotation of the first cam adjusts a position of the first Hall effect sensor without displacing the second Hall effect sensor and wherein rotation of the second cam adjusts a position of the second Hall effect sensor without displacing said first Hall effect sensor.

* * * * *